(12) United States Patent
Cho et al.

(10) Patent No.: US 11,005,419 B2
(45) Date of Patent: *May 11, 2021

(54) TEMPERATURE COMPENSATED OSCILLATOR DRIVER

(71) Applicant: Texas Instruments Incorporated, Dallas, TX (US)

(72) Inventors: Kunhee Cho, Austin, TX (US); Danielle Griffith, Richardson, TX (US); James Murdock, Richardson, TX (US); Per Torstein Roine, Oslo (NO)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/661,245

(22) Filed: Oct. 23, 2019

(65) Prior Publication Data

US 2020/0059197 A1    Feb. 20, 2020

Related U.S. Application Data

(63) Continuation of application No. 15/070,742, filed on Mar. 15, 2016, now Pat. No. 10,491,155.

(51) Int. Cl.
*H03B 5/04* (2006.01)
*H03B 5/36* (2006.01)
*H03B 5/08* (2006.01)
*H03B 5/00* (2006.01)
*H03B 5/32* (2006.01)
*H03L 5/00* (2006.01)
*H03L 1/02* (2006.01)
*H03L 1/00* (2006.01)
(Continued)

(52) U.S. Cl.
CPC ............... *H03B 5/04* (2013.01); *H03B 5/00* (2013.01); *H03B 5/08* (2013.01); *H03B 5/32* (2013.01); *H03B 5/36* (2013.01); *H03B 5/364* (2013.01); *H03B 5/366* (2013.01); *H03L 1/00* (2013.01); *H03L 1/022* (2013.01); *H03L 1/028* (2013.01); *H03L 5/00* (2013.01); *H03L 7/00* (2013.01); *H04W 84/18* (2013.01)

(58) Field of Classification Search
CPC ..... H03L 5/00; H03L 1/02; H03L 1/00; H03L 7/00; H03B 5/32; H03B 5/08; H03B 5/04; H03B 5/36; H03B 5/02; H03B 5/00; H03B 5/38; H04W 84/18
USPC .................................. 331/183, 176, 175, 158
See application file for complete search history.

(56) References Cited

U.S. PATENT DOCUMENTS 5,481,229 A * 1/1996 Connell ................. H03L 1/023
                                                           331/158
8,736,389 B2 * 5/2014 Wang ........................ H03L 1/028
                                                           331/116 FE (Continued)

*Primary Examiner* — Arnold M Kinkead
(74) *Attorney, Agent, or Firm* — Brian D. Graham; Charles A. Brill; Frank D. Cimino

(57) ABSTRACT

A circuit includes an oscillator having a driver and a resonator. The driver receives a supply voltage at a supply input and provides a drive output to drive the resonator to generate an oscillator output signal. A power converter receives an input voltage and generates the supply voltage to the supply input of the driver. A temperature tracking device in the power converter controls the voltage level of the supply voltage to the supply input of the driver based on temperature such that the supply voltage varies inversely to the temperature of the circuit.

20 Claims, 4 Drawing Sheets

(51) Int. Cl.
 *H03L 7/00* (2006.01)
 *H04W 84/18* (2009.01)

(56) References Cited

U.S. PATENT DOCUMENTS

| | | | |
|---|---|---|---|
| 10,491,155 B2* | 11/2019 | Cho | H03L 1/028 |
| 2007/0273453 A1* | 11/2007 | Maher | H03L 1/00 |
| | | | 331/176 |
| 2010/0188156 A1 | 7/2010 | Arai | |
| 2011/0050353 A1* | 3/2011 | Zhu | H03K 4/502 |
| | | | 331/108 A |
| 2014/0104012 A1 | 4/2014 | Zhou et al. | |
| 2015/0035378 A1 | 2/2015 | Calhoun et al. | |
| 2015/0145609 A1 | 5/2015 | Higuchi et al. | |
| 2016/0118905 A1* | 4/2016 | Freeman | H02M 3/33546 |
| | | | 363/21.1 |

* cited by examiner

| $V_{DD}$ | TEMPERATURE | $I_{DC}$ (nA) | POWER (nW) |
|---|---|---|---|
| 0.9 | -40 | 11.79 | 10.61 |
|  | 27 | 11.31 | 10.18 |
|  | 90 | 11.62 | 10.46 |
| 1.2 | -40 | 11.03 | 13.24 |
|  | 27 | 10.93 | 13.12 |
|  | 90 | 11.99 | 14.39 |

TEMPERATURE COMPENSATED OSCILLATOR DRIVER

This application is a continuation of U.S. patent application Ser. No. 15/070,742, filed Mar. 15, 2016, which are incorporated herein by reference in its entirety.

TECHNICAL FIELD

This disclosure relates to integrated circuits and more particularly to a temperature compensated oscillator driver.

BACKGROUND

A wireless sensor network (WSN) (sometimes referred to as a wireless sensor and actuator network (WSAN)) are spatially distributed autonomous sensors or nodes to monitor/control physical or environmental conditions such as temperature, sound, pressure and so forth. Sensors or actuators on the network cooperatively pass collected data through the network to a central location where data is analyzed and stored and/or commands sent to operate the respective network nodes. Many networks are bi-directional, and thus also enable control of sensor activity. These networks and nodes are used in many industrial and consumer applications such as industrial process monitoring and control, machine health monitoring, and so forth. One important factor for operating nodes on the network is for very low power consumption.

Power consumption in such networks is an important factor as the devices employed at each node are relatively inexpensive and often times operate from battery power. One manner in which to reduce the power of low power wireless networks is to have intermittent data transfer (burst operation) when sending and receiving data to the nodes. Sleep timers are sometimes employed to synchronize the burst operations. Since the sleep timer is usually always ON, the sleep timer needs to be both very low power and very accurate for lowest system power. However, conventional crystal oscillator drivers in the sleep timers have large temperature variation and thus cause high power consumption at high temperature which reduces battery lifetime.

SUMMARY

This disclosure relates to a temperature compensated oscillator driver. In one example, a circuit includes an oscillator having a driver and a resonator. The driver receives a supply voltage at a supply input and provides a drive output to drive the resonator to generate an oscillator output signal. A power converter receives an input voltage and generates the supply voltage to the supply input of the driver. A temperature tracking device in the power converter controls the voltage level of the supply voltage to the supply input of the driver based on temperature such that the supply voltage varies inversely to the temperature of the circuit.

In another example, a circuit includes an oscillator having a driver and a crystal resonator. The driver receives a supply voltage at a supply input and provides a drive output to drive the crystal resonator to generate an oscillator output signal. A linear regulator receives an input voltage and generates the supply voltage to the supply input of the driver. The linear regulator includes a pass transistor device to provide the supply voltage to the supply input of the driver and a leakage current generating device to supply current to operate a gate of the pass transistor device. A temperature tracking device is operatively coupled to the leakage current generating device and the gate of the pass transistor in the linear regulator. The temperature tracking device controls the voltage level of the supply voltage to the supply input of the driver via the pass transistor device based on temperature such that the supply voltage varies inversely proportional to the temperature of the circuit.

In yet another example, an apparatus includes a remote sensor device that includes a radio circuit to communicate with the device via a wireless network connection. The remote sensor device includes a timing circuit to operate the device. The timing circuit includes an oscillator having a driver and a crystal resonator. The driver receives a supply voltage at a supply input and provides a drive output to drive the crystal resonator to generate an oscillator output signal. A power converter in the timing circuit receives an input voltage and generates the supply voltage to the supply input of the driver. A temperature tracking device in the power converter controls the voltage level of the supply voltage to the supply input of the driver based on temperature such that the supply voltage input varies inversely proportional to the temperature of the timing circuit.

DETAILED DESCRIPTION

This disclosure relates to a temperature compensated oscillator driver. As temperature increases where oscillators (e.g., crystal oscillators) are employed, the respective driver circuits that operate in the respective oscillator circuits can experience a dramatic increase in current. Under such dynamic temperature conditions in conventional circuits, battery supply voltage supplying the driver can be reduced as the current load increases. The temperature compensated driver as described herein includes a power converter supplying voltage to the driver that reduces the supply voltage provided to the driver as temperature increases to mitigate power increases in the driver.

In one example, a circuit includes an oscillator having a driver and a resonator. The driver receives a supply voltage at a supply input and provides a drive output to drive the resonator to generate an oscillator output signal. The power converter in turn receives an input voltage and generates the supply voltage to the supply input of the driver. A temperature tracking device in the power converter controls the voltage level of the supply voltage to the supply input of the driver based on temperature. The voltage is controlled to the driver such that the supply voltage varies inversely to the circuit temperature (e.g., as temperature increases supply voltage decreases and vice versa). In this manner, driver power is mitigated as temperature increases enabling battery lifetime of circuits utilizing the oscillator and driver to be conserved. Various devices in the power converter can be selectively switched to adjust the operating range (e.g., voltage and/or current range operations over temperature) of the converter. Substantially any power converter can be employed that utilizes the temperature tracking device to reduce supply voltage based on temperature of the circuit as described herein. These converters can include linear regulators, switched-capacitor supplies, and inductive-based switching supplies, for example.

Figure 1:
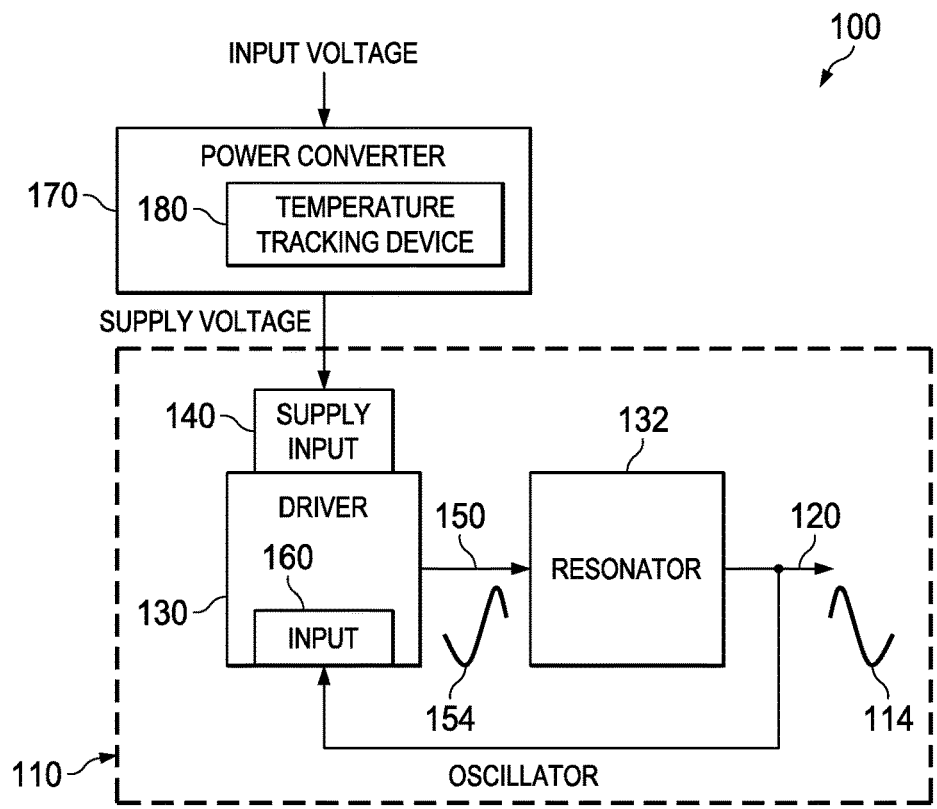
FIG. 1 illustrates a block diagram of an example circuit that provides temperature compensation for an oscillator driver.

FIG. 1 illustrates an example circuit 100 that provides temperature compensation for an oscillator driver. As used herein, the term circuit can include a collection of active and/or passive elements that perform a circuit function, such as an analog circuit, digital circuit or control circuit, for example. The term circuit can also include an integrated circuit where all the circuit elements are fabricated on a common substrate, for example. The circuit 100 includes an oscillator 110 having a driver 130 and a resonator 132 (e.g., crystal resonator). The driver receives a supply voltage at a supply input 140 and provides a drive output 150 to drive the resonator 132 to generate an oscillator output signal 114 at output 120. As shown, the drive output 150 drives a signal 154 to the resonator 132 where the signal 154 is out of phase with the oscillator signal 114. The signal 114 is fed back to an input 160 of the driver 130 where the driver operates as an inverter. A power converter 170 receives an input voltage and generates the supply voltage to the supply input 140 of the driver 130. A temperature tracking device 180 in the power converter 170 controls the voltage level of the supply voltage to the supply input 140 of the driver 130 based on temperature such that the supply voltage varies inversely to the temperature of the circuit 100. Thus, as temperature of the circuit 100 increases, the temperature tracking device 180 in the power converter 170 causes the supply voltage to dynamically decrease the supply voltage to the supply input 140 of the driver 130. In this manner, power can be mitigated in the circuit 100 since at lower values of supply voltage at input 140 the driver 130 consumes less power.

In an example, the resonator 132 can be a crystal resonator, a micro-electromechanical system (MEMS) resonator, or an LC network resonator however substantially any type of resonator circuit can be employed.

The power converter 170 can be substantially any type of regulated power supply that attempts to regulate a constant output supply voltage based on a given input voltage. As temperature changes however, the temperature tracking device 180 causes the supply voltage to the supply input 140 of the driver 130 to change to compensate for current changes within the driver due to changing temperature. The power converter 170 can be a switched capacitor power supply in one example or an inductor-based switching power supply that receives the input voltage and generates the supply voltage to the supply input 140 of the driver 130. In another example, the power converter 170 can be a linear regulator (e.g., low dropout regulator (LDO)) that receives the input voltage and generates the supply voltage to the supply input 140 of the driver 130.

If a linear regulator is employed as the power converter 170, the linear regulator can include a pass transistor device (See e.g., FIG. 4) to provide the supply voltage to the supply input 140 of the driver 130. The linear regulator can also include a leakage current generating device to supply current to operate a gate of the pass transistor device. In this configuration, gate leakage of the leakage current generating device supplies current to the temperature tracking device 180 to operate the gate of the pass transistor device. By using gate leakage to control current within the linear regulator, power in the regulator can further be conserved.

The temperature tracking device 180 can be a diode, a field effect transistor device junction, or a bipolar transistor device junction that varies its voltage inversely proportional to the temperature applied to the tracking device, for example. This variable voltage due to temperature is applied to the gate of the pass transistor device in the linear regulator to control the supply voltage at the supply input 140 of the driver 130. A programmable switching device (see e.g., FIG. 4) can be provided to adjust a range of current or voltage operations for the power converter 170. The switching device can configure a number of series pass transistor devices, a number of series leakage current generating devices, or a number of series or parallel temperature tracking devices in the linear regulator to adjust the range of current or voltage operations for the power converter 170.

Figure 2:
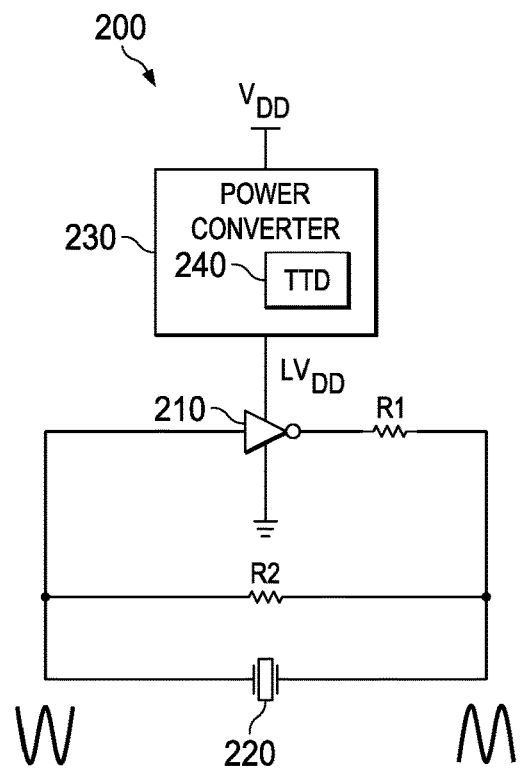
FIG. 2 illustrates a schematic block diagram of an example circuit that provides temperature compensation for a crystal oscillator driver.

FIG. 2 illustrates an example circuit 200 that provides temperature compensation for a crystal oscillator driver 210. The crystal oscillator driver 210 (also referred to as driver) is an inverter and drives its resistive output via resistor R1 to one leg of a crystal resonator 220. Another leg of the crystal resonator 220 is coupled to an input of the driver 210. A resistor R2 may also be employed to promote oscillator stability in the circuit 200. An input voltage shown as VDD drives a power converter 230 which provides a supply voltage LVDD (e.g., Local VDD) to operate the driver 210. In one example, VDD may be greater than 1 volt (e.g., 1.2 volts) and LVDD may be less than 1 volts (e.g., 0.5 volts). As temperature changes across the circuit 200, a temperature tracking device (TTD) 240 causes the voltage LVDD to change based on temperature in order to mitigate power losses in the driver 210 as described herein. The power converter 230 has some operating characteristics that are provided as temperature changes and are illustrated in voltage diagrams depicted in FIG. 3.

Figure 3:
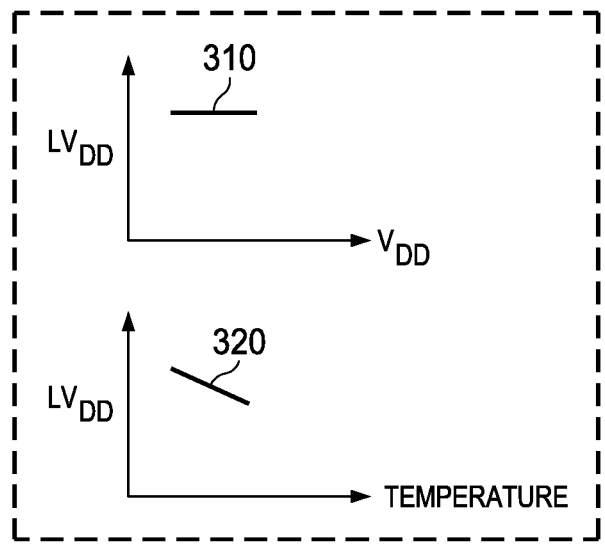
FIG. 3 illustrates example power characteristics for a power converter that provides temperature compensation for a crystal oscillator driver.

FIG. 3 illustrates example power characteristics for a power converter that provides temperature compensation for a crystal oscillator driver as described herein. One characteristic for the power converter described herein is at any given temperature, to maintain a substantially constant output voltage (LVDD) for a given input voltage (VDD). At 310, this relationship is shown where LVDD is illustrated on the vertical axis and VDD is illustrated on the horizontal axis. As shown, as VDD increases, LVDD is maintained at a substantially constant voltage. At 320, LVDD change characteristics are plotted as temperature changes along the vertical axis. As shown at 320, as temperature increases, the temperature tracking device described herein causes LVDD to decrease (e.g., decrease in a substantially linear manner).

Figure 4:
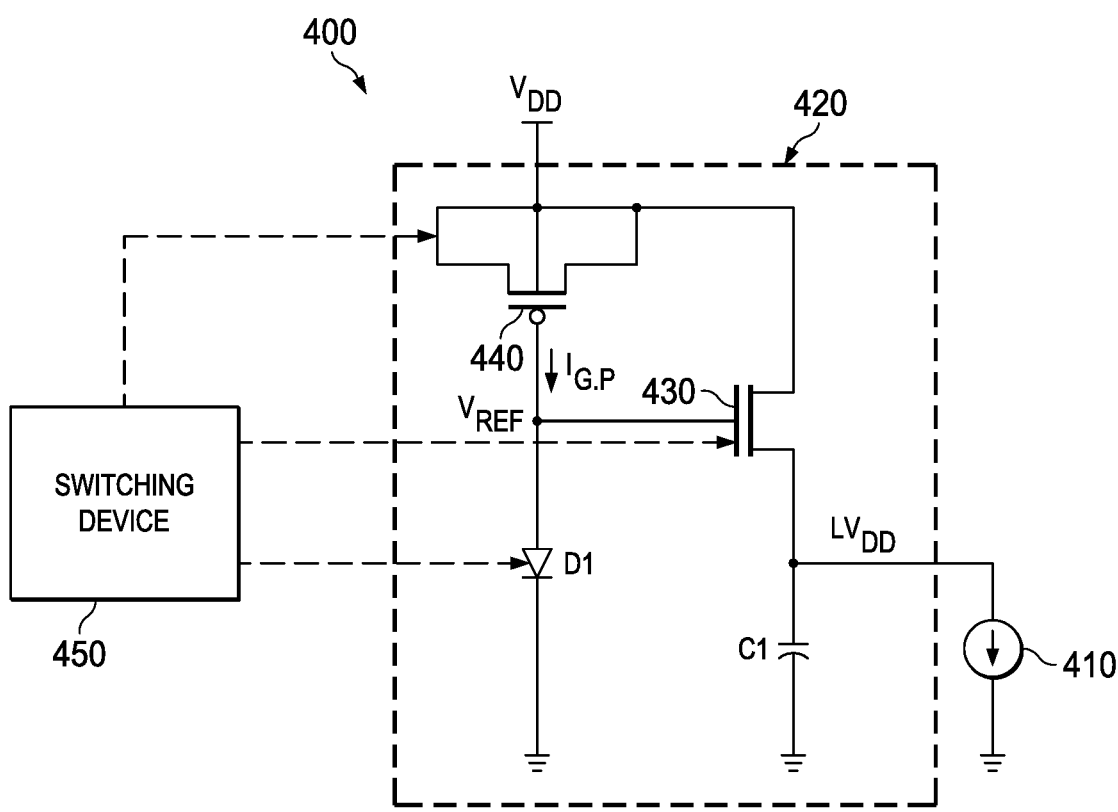
FIG. 4 illustrates a schematic diagram of a configurable power converter circuit that provides temperature compensation for a crystal oscillator driver.

FIG. 4 illustrates a configurable power converter circuit 400 that provides temperature compensation for a crystal oscillator driver. In this circuit example, the crystal resonator and driver forming an oscillator described herein are represented as load current 410 for illustrative purposes. A linear regulator 420 operating as the power converter described herein receives an input voltage VDD and generates the supply voltage LVDD to the supply input of the driver (See e.g., FIGS. 1 and 2). The linear regulator 420 includes a pass transistor device 430 to provide the supply voltage LVDD to the supply input of the driver represented as the current source 410. A capacitor C1 (or capacitors) may also be present to fitter LVDD. A leakage current generating device 440 supplies current to a diode D1 to operate a gate of the pass transistor device 430. In this example, diode D1 operates as the temperature tracking device described herein and is operatively coupled to the leakage current generating device 440 and the gate of the pass transistor 430 in the linear regulator 420. The temperature tracking device D1 controls the voltage level of the supply voltage LVDD to the supply input of the driver via the pass transistor device 430 based on temperature such that the supply voltage LVDD varies inversely proportional to the temperature. As the temperature of D1 increases, its voltage drop decreases and causes a decrease in LVDD via gate control of the pass transistor device 430.

In order to maintain the lowest power levels in the linear regulator 420, gate leakage of the leakage current generating device 440 supplies current to the temperature tracking device D1 to operate the gate of the pass transistor device 430. As noted previously, the temperature tracking device D1 can be a diode such as in this example. Other examples include a field effect transistor device junction, or a bipolar transistor device junction that varies its voltage inversely proportional to the temperature applied to the tracking device. This variable voltage due to temperature is applied to the gate of the pass transistor device 430 to control the supply voltage LVDD.

A programmable switching device 450 can be employed to adjust a range of current or voltage operations for the linear regulator. The switching device 450 can be programmed via factory setting commands, onsite user commands, and/or via remote network control commands, for example. The switching device 450 can include user programmable switches that enable or disable one or more series and/or parallel devices in the linear regulator 420 to control the range of operations of the regulator. Disabling can include closing a switch that shorts a series device whereas enabling can include opening a switch to effectively insert the series device into the circuit. For example, the switching device 450 can configure a number of series pass transistor devices 430 or a number of series leakage current generating devices 440 by enabling or disabling control switches across the respective series devices. Programming can also include switching a number of series or parallel temperature tracking devices to adjust the range of current or voltage operations for the linear regulator 420.

Figures 5, 6:
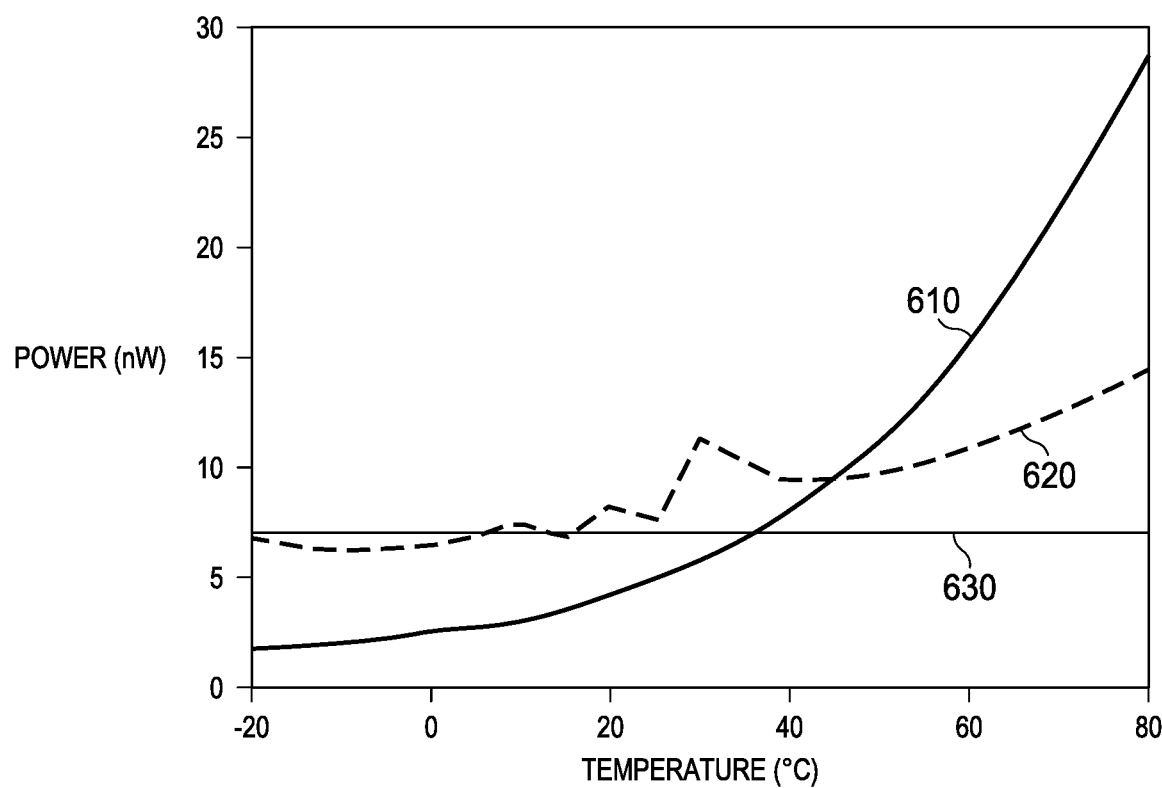
FIG. 5 illustrates an example table of operating ranges for a circuit that provides temperature compensation for a crystal oscillator driver.
FIG. 6 illustrates example operating power curves for a circuit that provides temperature compensation for a crystal oscillator driver.

FIG. 5 illustrates an example table 500 of operating ranges for a circuit that provides temperature compensation for a crystal oscillator driver. As shown, for a given value of VDD and across temperature ranges of −40 C to about 90 C, current in the driver is maintained at a relatively constant value of about 11 nano amperes (nA) and power is maintained at about 10.5 nano watts (nW). If VDD is increased to 1.2 volts, the current in the converter is maintained at about 11 nA but power increases to about 13 nW due to power conversion losses in the linear regulator at higher values of VDD.

FIG. 6 illustrates example operating power curves for a circuit that provides temperature compensation for a crystal oscillator driver. In this example, conventional power curves 610 and 620 are shown where power is plotted on the vertical axis versus temperature on the horizontal axis. Each of the conventional curves 610 and 620 illustrate that as temperature increases, power in the driver increases. When using the temperature tracking devices as described herein, the power curve 630 can be provided which shows that as temperature increases, power in the driver circuit is held substantially constant in the driver circuit over time due to altering the supply voltage to the driver based on temperature as described herein.

Figure 7:
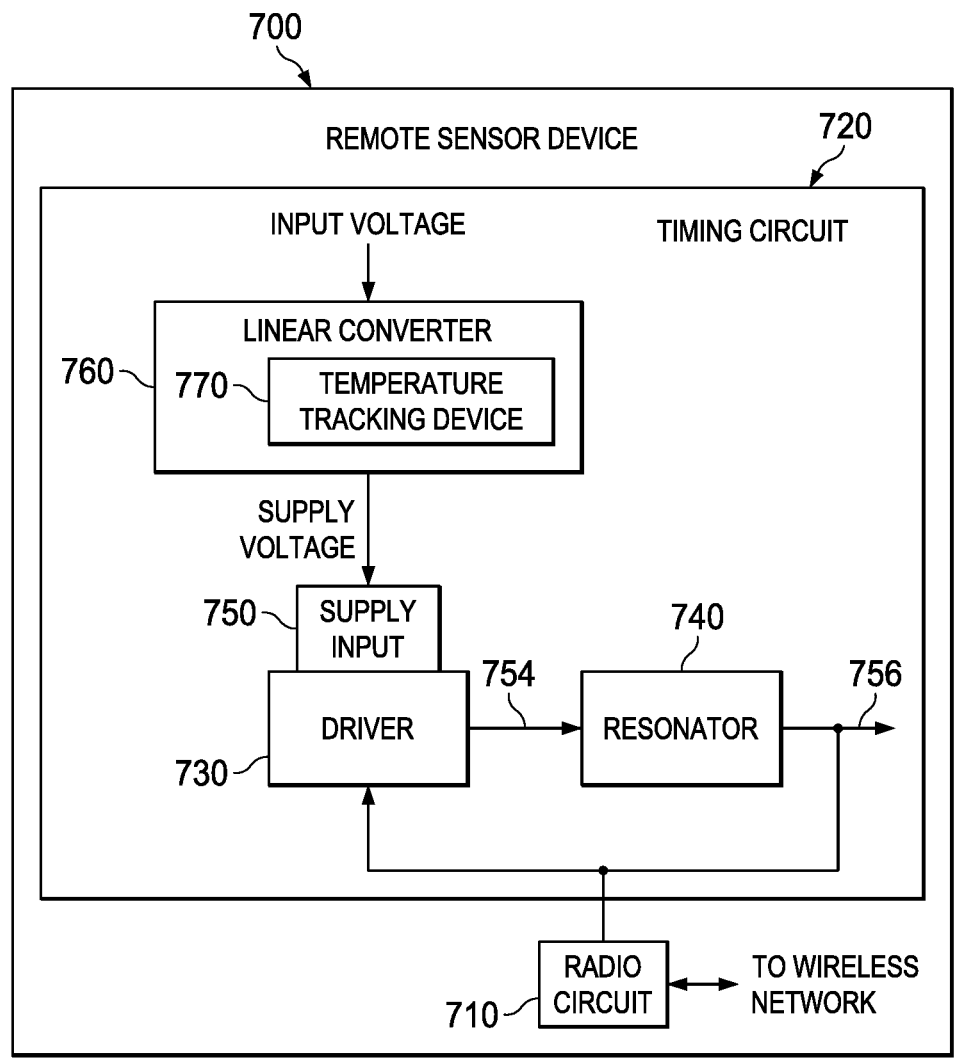
FIG. 7 illustrates a block diagram of an example apparatus that provides temperature compensation for an oscillator driver in a remote sensor device.

FIG. 7 illustrates an example apparatus that provides temperature compensation for an oscillator driver in a remote sensor device 700. The remote sensor device 700 (e.g., sensor, data collector, or controllable output device) includes a radio circuit 710 to communicate with the device via a wireless network connection. The remote sensor device 700 includes a timing circuit 720 to operate the device. The timing circuit 720 includes an oscillator having a driver 730 and a crystal resonator 740. The driver 730 receives a supply voltage at a supply input 750 and provides a drive output 754 to drive the crystal resonator 740 to generate an oscillator output signal at output 756. A power converter 760 in the timing circuit 720 receives an input voltage and generates the supply voltage to the supply input 750 of the driver 730. A temperature tracking device 770 in the power converter 760 controls the voltage level of the supply voltage to the supply input 750 of the driver 730 based on temperature such that the supply voltage input varies inversely proportional to the temperature of the timing circuit 720.

As noted previously, the power converter 760 can be a linear regulator that receives the input voltage and generates the supply voltage to the supply input 750 of the driver 730. The linear regulator can include a pass transistor device to provide the supply voltage to the supply input 750 of the driver 730 and a leakage current generating device to supply current to operate a gate of the pass transistor device. Gate leakage of the leakage current generating device can be employed to supply current to the temperature tracking device 770 to operate the gate of the pass transistor device. The temperature tracking device 770 can be a diode, a field effect transistor device junction, or a bipolar transistor device junction that varies its voltage inversely proportional to the temperature applied to the tracking device and the voltage is applied to the gate of the pass transistor device to control the supply voltage. A programmable switching device (See E.g., FIG. 4) can be provided to adjust a range of current or voltage operations for the power converter 760.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "Includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit, comprising:
  a power converter comprising:
    an input configured to receive an input voltage;
    an output;
    a first transistor that includes a source coupled to the input, a drain coupled to the input; and a gate;
    a pass transistor device coupled between the input and the output that includes a gate coupled to the gate of the first transistor; and
    a temperature tracking device coupled to the gate of the first transistor and the gate of the pass transistor device, the power converter configured to generate a supply voltage at the output based on the input voltage and based on a temperature of the circuit;

a programmable switching device coupled to the power converter, the programmable switching device configured to adjust a range of current or voltage for the power converter; and an oscillator having an input coupled to the output of the power converter.

2. The circuit of claim 1, the oscillator comprising:
a driver comprising:
an input coupled to the output of the power converter; and
an output, the driver configured to generate a drive output based on the supply voltage; and
a resonator comprising:
an input coupled to the output of the driver; and
an output, the resonator configured to generate an oscillator output signal at the output based on the drive output.

3. The circuit of claim 2, wherein the resonator is a crystal resonator, a micro-electromechanical system (MEMS) resonator, or an LC network resonator.

4. The circuit of claim 2, wherein the power converter is a switched capacitor power supply or an inductor-based switching power supply that receives the input voltage and generates the supply voltage to the input of the driver.

5. The circuit of claim 2, wherein the power converter is a linear regulator that receives the input voltage and generates the supply voltage to the input of the driver.

6. The circuit of claim 1, wherein gate leakage of the first transistor supplies current to the temperature tracking device to operate the gate of the pass transistor device.

7. The circuit of claim 6, wherein the temperature tracking device is a diode, a field effect transistor device junction, or a bipolar transistor device junction that varies its voltage inversely proportional to the temperature applied to the temperature tracking device and the voltage is applied to the gate of the pass transistor device to control the supply voltage.

8. The circuit of claim 5, wherein the programmable switching device configures a number of series pass transistor devices that includes the pass transistor device, a number of series leakage current generating devices that includes the first transistor, or a number of series or parallel temperature tracking devices that includes the temperature tracking device to adjust the range of current or voltage operations for the power converter.

9. A linear regulator, comprising:
an output;
a first transistor that includes a source, a drain coupled to the source, and a gate coupled to a node;
a second transistor coupled between the output and the source and drain of the first transistor that includes a gate coupled to the node; and
a temperature tracking device coupled to the node.

10. The linear regulator of claim 9, wherein the temperature tracking device is a diode, a field effect transistor device junction, or a bipolar transistor device junction.

11. The linear regulator of claim 9, wherein the second transistor is configured to generate a supply voltage at an output of the linear regulator.

12. The linear regulator of claim 11, wherein the supply voltage varies inversely with temperature.

13. A linear regulator, comprising:
a temperature tracking device;
a leakage current generating device coupled to the temperature tracking device, the leakage current generating device configured to receive an input voltage at an input of the linear regulator; and
a pass transistor device coupled to the temperature tracking device and to the leakage current generating device, the pass transistor device configured to generate a voltage level of a supply voltage at an output of the linear regulator based on the input voltage and inversely based on a temperature of the linear regulator.

14. The linear regulator of claim 13, wherein the leakage current generating device is configured to supply current to operate a gate of the pass transistor device.

15. The linear regulator of claim 14, wherein gate leakage of the leakage current generating device supplies current to the temperature tracking device to operate the gate of the pass transistor device.

16. The linear regulator of claim 15, wherein the temperature tracking device is a diode, a field effect transistor device junction, or a bipolar transistor device junction that varies its voltage inversely proportional to the temperature applied to the temperature tracking device and the voltage is applied to the gate of the pass transistor device to control the supply voltage.

17. The circuit of claim 1, wherein the temperature tracking device includes a first terminal coupled to the gate of the first transistor and the gate of the pass transistor device and a second terminal coupled to a ground node.

18. The circuit of claim 1, wherein the power converter further includes a capacitor coupled between the output and a ground node.

19. The circuit of claim 1, wherein the first transistor includes a body coupled to the input.

20. The linear regulator of claim 9, wherein the source and the drain of the first transistor are coupled to a voltage source, and the second transistor is coupled to the voltage source.

* * * * *